(12) United States Patent
Enami

(10) Patent No.: US 10,155,852 B2
(45) Date of Patent: Dec. 18, 2018

(54) SILICONE GEL COMPOSITION

(71) Applicant: DOW CORNING TORAY CO., LTD., Tokyo (JP)

(72) Inventor: Hiroji Enami, Chiba (JP)

(73) Assignee: DOW CORNING TORAY CO., LTD., Tokyo (JP)

( * ) Notice: Subject to any disclaimer, the term of this patent is extended or adjusted under 35 U.S.C. 154(b) by 162 days.

(21) Appl. No.: 15/121,892

(22) PCT Filed: Jan. 22, 2015

(86) PCT No.: PCT/JP2015/000292
§ 371 (c)(1),
(2) Date: Aug. 26, 2016

(87) PCT Pub. No.: WO2015/111409
PCT Pub. Date: Jul. 30, 2015

(65) Prior Publication Data
US 2017/0022326 A1 Jan. 26, 2017

(30) Foreign Application Priority Data
Jan. 27, 2014 (JP) .................................. 2014-012755

(51) Int. Cl.
| | | |
|---|---|---|
| *C08G 77/44* | (2006.01) | |
| *C08K 5/5415* | (2006.01) | |
| *C08L 83/04* | (2006.01) | |
| *C08L 83/14* | (2006.01) | |
| *H01L 23/29* | (2006.01) | |
| *C08K 5/00* | (2006.01) | |
| *C08K 5/06* | (2006.01) | |
| *C08K 5/5435* | (2006.01) | |
| *C08K 5/549* | (2006.01) | |
| *C08G 77/12* | (2006.01) | |
| *C08G 77/20* | (2006.01) | |

(52) U.S. Cl.
CPC ............ *C08G 77/44* (2013.01); *C08K 5/0091* (2013.01); *C08K 5/06* (2013.01); *C08K 5/549* (2013.01); *C08K 5/5415* (2013.01); *C08K 5/5435* (2013.01); *C08L 83/04* (2013.01); *C08L 83/14* (2013.01); *H01L 23/296* (2013.01); *C08G 77/12* (2013.01); *C08G 77/20* (2013.01); *H01L 2924/0002* (2013.01)

(58) Field of Classification Search
CPC ........ C08G 77/12; C08G 77/20; H01L 23/296
See application file for complete search history.

(56) References Cited

U.S. PATENT DOCUMENTS

| | | |
|---|---|---|
| 3,253,174 A | 5/1966 | Elmer et al. |
| 4,374,967 A | 2/1983 | Brown et al. |
| 6,001,918 A | 12/1999 | Enami et al. |
| 6,001,943 A * | 12/1999 | Enami ................ C08L 83/04 427/387 |
| 2002/0070439 A1 | 6/2002 | Hiramatsu et al. |
| 2004/0147702 A1 | 7/2004 | Terada et al. |
| 2007/0012147 A1 * | 1/2007 | Kawai ................ B23Q 35/127 83/72 |
| 2007/0112147 A1 | 5/2007 | Morita et al. |
| 2010/0301377 A1 | 12/2010 | Kato et al. |
| 2011/0306746 A1 | 12/2011 | Tanaka et al. |

FOREIGN PATENT DOCUMENTS

| | | |
|---|---|---|
| JP | S48017847 | 6/1973 |
| JP | S587452 A | 1/1983 |
| JP | S59204259 A | 11/1984 |
| JP | 61048945 A | 3/1986 |
| JP | S62104145 A | 5/1987 |
| JP | H0319269 A | 1/1991 |
| JP | H03139565 A | 6/1991 |
| JP | H08225743 A | 9/1996 |
| JP | H10212413 A | 8/1998 |
| JP | H1129710 A | 2/1999 |
| JP | H1140703 A | 2/1999 |
| JP | 2002184941 A | 6/2002 |
| JP | 2002322364 A | 11/2002 |

(Continued)

OTHER PUBLICATIONS

VanKrevelen (Properties of Polymers, 1976, pp. 280-283) (Year: 1976).*
PCT/JP2015/000292 International Search Report dated Apr. 14, 2015, 4 pages.
English language abstract and machine translation for JPS59204259 (A) extracted from https://worldwinde.espacenet.com database on Aug. 23, 2016, 6 pages.
English language abstract and machine translation for JPS61048945 (A) extracted from https://worldwinde.espacenet.com database on Aug. 23, 2016, 6 pages.
English language abstract and machine translation for JPS62104145 (A) extracted from https://worldwinde.espacenet.com database on Aug. 24, 2016, 5 pages.
English language abstract and machine translation for JPH0319269 (A) extracted from https://worldwinde.espacenet.com database on Aug. 25, 2016, 13 pages.

(Continued)

*Primary Examiner* — Kuo Liang Peng
(74) *Attorney, Agent, or Firm* — Warner Norcross & Judd LLP

(57) ABSTRACT

A silicone gel composition for use in sealing or filling of electrical or electronic parts comprising at least one adhesion promoter (Z), and by curing to form a silicone gel having, at 25° C. and a shear frequency of 0.1 Hz, a loss elastic modulus of from $5.0 \times 10^3$ to $1.0 \times 10^5$ dyne/cm$^2$, a complex elastic modulus of from $5.0 \times 10^4$ to $1.0 \times 10^6$ dyne/cm$^2$, and a loss tangent of 0.3 or less. The silicone gel composition is provided, which can suppress the occurrence of air bubbles or cracks in silicone gel that seals or fills an electrical or electronic part and has excellent bonding to the electrical or electronic part even when used under high-temperature conditions as in a power device; and a silicone gel is provided, which can suppress the occurrence of air bubbles or cracks when it seals or fills an electrical or electronic part.

17 Claims, 1 Drawing Sheet

(56) References Cited

FOREIGN PATENT DOCUMENTS

| JP | 2005105217 A | 4/2005 |
|----|--------------|--------|
| JP | 200850494 A | 3/2008 |
| JP | 201217458 A | 1/2012 |

OTHER PUBLICATIONS

English language abstract and machine translation for JPH03139565 (A) extracted from https://worldwinde.espacenet.com database on Aug. 23, 2016, 9 pages.
English language abstract and machine translation for JPH08225743 (A) extracted from https://worldwinde.espacenet.com database on Aug. 23, 2016, 11 pages.
English language abstract and machine translation for JPH1140703 (A) extracted from https://worldwinde.espacenet.com database on Aug. 23, 2016, 10 pages.

* cited by examiner

[Fig. 1]
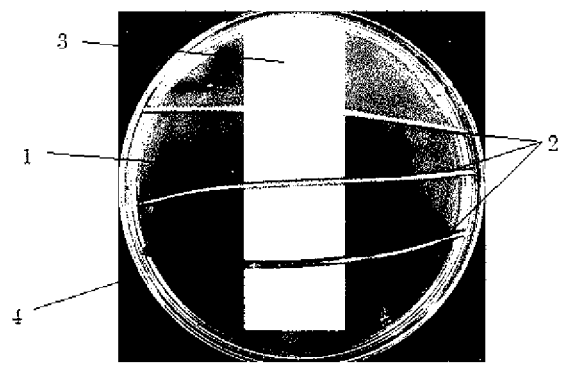
[Fig. 2]
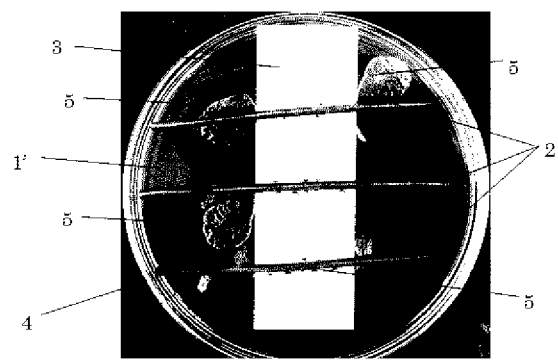

SILICONE GEL COMPOSITION

CROSS-REFERENCE TO RELATED APPLICATIONS

This application is the National Stage of International Application No. PCT/JP2015/000292 filed on 22 Jan. 2015, which claims priority to and all advantages of Japanese Patent Application No. 2014-012755 filed on 27 Jan. 2014, the content of which is hereby incorporated by reference.

TECHNICAL FIELD

The present invention relates to a silicone gel composition and silicone gel for use in sealing or filling of electrical or electronic parts, and particularly relates to a silicone gel composition for use in sealing or filling of electrical or electronic parts that can form a silicone gel which, compared to conventional known silicone gels, can suppress the occurrence of air bubbles and cracks in the silicone gel and has excellent bonding to an electrical or electronic part when it seals or fills the electrical or electronic part, and a silicone gel that can suppress the occurrence of air bubbles and cracks when it seals or fills an electrical or electronic part.

BACKGROUND ART

Silicone gel compositions have been widely used as sealants and fillers for electrical or electronic parts because they can form silicone gels having good stress relaxation, electrical characteristics, heat resistance and weather resistance by curing (refer to Patent Documents 1 to 3). Examples of such silicone gel compositions include a silicone gel composition comprising an organopolysiloxane containing vinyl groups, having a branched structure and having viscosity of from 10 to 10,000 centistokes at 25 C., a linear organopolysiloxane containing hydrogen atoms bonded to silicon atoms, and a hydrosilylation reaction catalyst (refer to Patent Document 4); a silicone gel composition comprising an organopolysiloxane containing vinyl groups having a branched structure, an organopolysiloxane containing hydrogen atoms bonded to silicon atoms, and a hydrosilylation reaction catalyst (refer to Patent Document 5); and a silicone gel composition comprising an organopolysiloxane containing vinyl groups, having a branched structure and having a viscosity of from 20 to 10,000 centistokes at 25 C., a linear organopolysiloxane capped by vinyl groups at both ends of its molecular chain, a linear organopolysiloxane containing hydrogen atoms bonded to silicon atoms only at both ends of its molecular chain, and a hydrosilylation reaction catalyst (refer to Patent Document 6).

On the other hand, the present inventors proposed that a silicone gel composition for sealing or filling of electrical or electronic parts which suppresses the occurrence of air bubbles and cracks in silicone gel can be provided and that an electrical or electronic part having excellent reliability can be provided by using a silicone gel composition which, by curing, forms a silicone gel having, at 25 C. and a shear frequency of 0.1 Hz, a loss elastic modulus of from $1.0 \times 10^3$ to $1.0 \times 10^5$ dyne/cm$^2$ and a complex elastic modulus of $1.0 \times 10^6$ dyne/cm$^2$ or less, and, advantageously, having 1/4 consistency of from 30 to 80 (refer to Patent Document 7, especially Practical Example 5). Similarly, it has been proposed that the occurrence of air bubbles, cracks and interface debonding can be prevented and operational reliability of a semiconductor device can be assured, even when heat cycling or vibration is applied to the semiconductor device, by using a silicone resin having a certain penetration and, advantageously, having a loss elastic modulus adjusted to 17% or greater of the storage elastic modulus (refer to Patent Document 8).

CITATION LIST

Patent Literature

Patent Document 1: Japanese Unexamined Patent Application Publication No. S59-204259A
Patent Document 2: Japanese Unexamined Patent Application Publication No. S61-048945A
Patent Document 3: Japanese Unexamined Patent Application Publication No. S62-104145A
Patent Document 4: Japanese Unexamined Patent Application Publication No. S48-017847A
Patent Document 5: Japanese Unexamined Patent Application Publication No. S58-007452A
Patent Document 6: Japanese Examined Patent Application Publication No. H03-019269B
Patent Document 7: Japanese Unexamined Patent Application Publication No. H10-212413A
Patent Document 8: Japanese Unexamined Patent Application Publication No. 2002-184941A

SUMMARY OF INVENTION

Technical Problem

Recently, however, with the increased ubiquity of electronic parts applications called power devices, the operating temperature of these electronic parts, particularly silicon chips, has risen from about 150 C. in the past to about 175 C., and due to the increased ubiquity of SiC semiconductors, operating temperatures of, for example, 180 C. or above are often required. If gel obtained from a conventional known silicone gel composition is used under such temperature conditions, there is the problem that the occurrence of air bubbles and cracks in the silicone gel cannot be sufficiently suppressed, and the reliability, durability and stability of the electrical or electronic part is diminished. This problem is pronounced particularly in cases where a conventional silicone gel composition seals or fills an electrical or electronic part having a complex structure, for example, a structure in which the space between electrodes, between electrical elements or between an electrical element and the package in the electrical or electronic part is narrow, or having a structure in which these structures cannot track to the expansion and contraction of the silicone gel. By exposing such an electrical or electronic part to high-temperature conditions, bubbles or cracks may occur in the silicone gel, and the reliability of the electrical or electronic part may be greatly reduced. Additionally, to use this silicone gel for protecting an electrical or electronic part, it must maintain good bonding with the electrical or electronic part even when exposed to high-temperature conditions. No silicone gel that satisfies these various characteristics has been known.

The object of the present invention is to provide a silicone gel composition for use in sealing or filling of electrical or electronic parts that can form a silicone gel that can suppress the occurrence of air bubbles and cracks and exhibits good bonding to the electrical or electronic parts even when used under high-temperature conditions.

Another object of the present invention is to provide a silicone gel that can suppress the occurrence of air bubbles and cracks and has excellent bonding to the electrical or electronic parts even under high-temperature conditions. Further objects of the present invention are to provide an electrical or electronic part such as a power device having excellent reliability, and to provide a protection method for a semiconductor chip having excellent reliability.

Solution to Problem

As a result of diligent research to solve the above problem, the present inventors discovered that the above problem can be solved by using a silicone gel composition for use in sealing or filling of electrical or electronic parts, in which the silicone gel composition comprises at least one adhesion promoter (Z) and, by curing, forms a silicone gel having, at 25 C. and a shear frequency of 0.1 Hz, a loss elastic modulus of from $5.0 \times 10^3$ to $1.0 \times 10^5$ dyne/cm$^2$, a complex elastic modulus of from $5.0 \times 10^4$ to $1.0 \times 10^6$ dyne/cm$^2$, and a loss tangent of 0.3 or less, and they thereby achieved the present invention. Furthermore, the complex elastic modulus is preferred to be from $5.0 \times 10^4$ to $5.0 \times 10^5$ dyne/cm$^2$.

Preferably, the silicone gel composition is curable by hydrosilylation reaction.

The silicone gel composition preferably comprises (A) an organopolysiloxane containing alkenyl groups, having a viscosity of from 10 to 100,000 mPa s at 25 C.;

(B) a linear organopolysiloxane containing hydrogen atoms bonded to silicon atoms at least at both ends of its molecular chain and having a viscosity of from 1 to 10,000 mPa s at 25 C., in an amount wherein a quantity of the hydrogen atoms bonded to silicon atoms is from 0.2 to 5 moles per mole of alkenyl groups contained in component (A);

(C) a catalytic amount of a hydrosilylation reaction catalyst; and (Z) at least one adhesion promoter.

The silicone gel composition preferably comprises (A-1) an organopolysiloxane containing alkenyl groups, having a branched structure and a viscosity of from 10 to 100,000 mPa s at 25 C.;

(A-2) a linear organopolysiloxane containing alkenyl groups, having a viscosity of from 10 to 100,000 mPa s at 25 C.;

(B) a linear organopolysiloxane containing hydrogen atoms bonded to silicon atoms at least at both ends of its molecular chain and having a viscosity of from 1 to 10,000 mPa s at 25 C., in an amount wherein a quantity of the hydrogen atoms bonded to silicon atoms is from 0.2 to 5 moles per mole of alkenyl groups contained in components (A-1) and (A-2);

(C) a catalytic amount of a hydrosilylation reaction catalyst; and (Z) at least one adhesion promoter.

The silicone gel composition preferably comprises (A-1T) an organopolysiloxane containing alkenyl groups, wherein the organopolysiloxane has a branched structure having at least one siloxane unit represented by RSiO$_{1.5}$ (R represents a monovalent hydrocarbon group) and has from 0.10 to 1.00 mass % of vinyl group moieties (CH$_2$=CH—) in a molecule and a viscosity of from 10 to 5,000 mPa s at 25 C.;

(A-2L) a linear organopolysiloxane containing alkenyl groups only at both ends of its molecular chain, having a viscosity of from 50 to 10,000 mPa s at 25 C.;

(B) a linear organopolysiloxane containing hydrogen atoms bonded to silicon atoms only at both ends of its molecular chain and having a viscosity of from 1 to 10,000 mPa s at 25 C., in an amount wherein a quantity of the hydrogen atoms bonded to silicon atoms is from 0.2 to 5 moles per mole of alkenyl groups contained in components (A-1T) and (A-2L);

(C) a catalytic amount of a hydrosilylation reaction catalyst; and (Z) at least one adhesion promoter.

In particular, the present inventors discovered that the above problem can be more advantageously solved by a silicone composition in which the weight ratio of component (A-1)/component (A-2) or component (A-1T)/component (A-2L) is 0.85 or less.

Preferably, component (A-1T) is a mixture of at least two organopolysiloxanes containing alkenyl groups with a branched structure, which differ in the amount of vinyl group moieties (CH$_2$=CH—) in a molecule.

Preferably, component (A-1T) is a mixture of component (A-1T1), which comprises from 0.10 to 0.30 mass % of vinyl group moieties (CH$_2$=CH—) in a molecule, and component (A-1T2), which comprises from 0.30 to 1.00 mass % of vinyl group moieties (CH$_2$=CH—) in a molecule, the ratio of (A-1T1):(A-1T2) being from 1:9 to 9:1.

The present invention further relates to a silicone gel obtained by curing the above silicone gel composition.

The silicone gel preferably has 1/4 consistency as stipulated in JIS K 2220 of from 10 to 80, and more preferably from 20 to 80.

The present invention further relates to a sealant for electrical or electronic parts, comprising the above silicone gel composition.

The present invention further relates to an electrical or electronic part equipped with the above silicone gel.

The electrical or electronic part is preferably a power device such as a motor control, a motor control for transport, a power generation system, or a space transportation system.

The present invention further relates to a protection method for a semiconductor chip using the above silicone gel composition or silicone gel.

Advantageous Effects of Invention

By the silicone gel composition according to the present invention, a silicone gel that can suppress the occurrence of air bubbles and cracks and has excellent bonding to electrical or electronic parts even when used under high-temperature conditions can be formed.

By the silicone gel according to the present invention, a silicone gel that can suppress the occurrence of air bubbles and cracks and exhibits excellent bonding to electrical or electronic parts even when used under high-temperature conditions can be provided. Furthermore, by the sealant for electrical or electronic parts according to the present invention, electrical or electronic parts that have high reliability and stability even under high-temperature conditions can be provided because it contains the above silicone gel composition. Furthermore, by the electrical or electronic part according to the present invention, it has high reliability and stability even under high-temperature conditions because it is equipped with the above silicone gel. Additionally, by the protection method for a semiconductor device according to the present invention, electrical or electronic parts, particularly power devices, having high reliability and stability even under high-temperature conditions can be provided because it uses the above silicone gel.

BRIEF DESCRIPTION OF DRAWINGS

FIG. 1 is an optical photographic image from the top surface of an electrical or electronic part sample evaluated in Practical Example 8 of the present invention.

FIG. 2 is an optical photographic image from the top surface of an electrical or electronic part sample evaluated in Comparative Example 4.

DESCRIPTION OF EMBODIMENTS

Detailed explanations of the invention will now be given. Note that in the present specification, viscosity is the value measured using a type-B viscometer according to JIS K 7117-1 at 25 C.

<Silicone Gel Composition>

The silicone gel composition according to the present invention is for use in sealing or filling of electrical or electronic parts, and comprises at least one adhesion promoter (Z). The silicone gel composition, by curing, forms a silicone gel having, at 25 C. and a shear frequency of 0.1 Hz, a loss elastic modulus of from $5.0\times10^3$ to $1.0\times10^5$ dyne/cm$^2$, a complex elastic modulus of from $5.0\times10^4$ to $1.0\times10^6$ dyne/cm$^2$, and a loss tangent of 0.3 or less. Furthermore, the complex elastic modulus is preferred to be from $5.0\times10^4$ to $5.0\times10^5$ dyne/cm$^2$.

The present invention came about through the discovery that an electrical or electronic part sealed or filled with a silicone gel exhibiting a loss elastic modulus, complex elastic modulus, and loss tangent in the above specified ranges can markedly suppress the occurrence of air bubbles and cracks in the silicone gel even under high-temperature conditions. Note that in the present specification, the expression "electrical/electronic part" means an electrical part or electronic part, and the expression "sealing/filling" means sealing or filling.

The loss elastic modulus, complex elastic modulus, and loss tangent at 25 C. and a shear frequency of 0.1 Hz of a silicone gel obtained by curing a silicone gel composition can be easily measured by methods known to persons skilled in the art. For example, they may be determined by preparing the silicone gel into a circular plate of thickness from 5 to 6 mm and diameter of 25 mm, and then measuring under the conditions of 25 C. and shear frequency 0.1 Hz using a dynamic viscoelasticity measurement apparatus. The dynamic viscoelasticity measurement apparatus may be an apparatus known to persons skilled in the art without particularly limitation, an example of which is a dynamic viscoelasticity measurement apparatus manufactured by Rheometrics, Inc. (product name: Dynamic Analyzer ARES). The loss elastic modulus, complex elastic modulus, and loss tangent of such a silicone gel in the above specified ranges can be adjusted as appropriate by changing the composition, curing mechanism, curing conditions and the like of the silicone gel composition.

Additionally, it is preferable if the 1/4 consistency as stipulated in JIS K 2220 of the silicone gel obtained by curing the silicone gel composition is from 10 to 80, more preferably from 20 to 80, because the occurrence of air bubbles and cracks in the silicone gel under high-temperature conditions is markedly suppressed.

The curing mechanism of the silicone gel composition is not particularly limited, and examples are hydrosilylation reaction curing by alkenyl groups and hydrogen atoms bonded to silicon atoms, dealcoholizing condensation reaction curing by silanol groups and alkoxy groups bonded to silicon atoms, and radical reaction curing by ultraviolet light irradiation, among which hydrosilylation reaction curing is preferred because complete curing is relatively quick.

The adhesion promoter (Z) is one of the mandatory components of the present invention, and is a component that improves bonding to the silicone gel substrate and the like. By using the adhesion promoter (Z), bonding to the electrical or electronic part is improved and interface debonding between the silicone gel and electrical or electronic part when heated is suppressed while the various characteristics of the silicone gel are maintained, and as a result, the reliability of the electrical or electronic part can be improved.

The adhesion promoter (Z) is not particularly limited provided that it can achieve the above objects, but examples include alkoxysilanes containing epoxy groups, such as 3-glycidoxypropyltrimethoxysilane, 3-glycidoxypropyltriethoxysilane, 3-glycidoxypropylmethyldimethoxysilane, 2-(3,4-epoxycyclohexyl)ethyltrimethoxysilane, and 4-oxiranylbutyltrimethoxysilane; alkoxysilanes containing acrylic groups, such as 3-methacryloxypropyltrimethoxysilane, 3-methacryloxypropyltriethoxysilane, and 3-acryloxypropyltrimethoxysilane; alkoxysilanes containing amino groups, such as 3-aminopropyltrimethoxysilane, 3-aminopropyltriethoxysilane, N-(2-aminoethyl)-3-aminopropyltrimethoxysilane, and N-phenyl-3-aminopropyltrimethoxysilane; silane coupling agent reaction condensates, such as bis(trimethoxysilyl)propane, bis(trimethoxysilyl)hexane, and carbasilatran, which is a reaction condensate of an alkylsilane containing epoxy groups and an alkoxysilane containing amino groups; titanium compounds such as organotitanium compounds, such as tetraethyltitanate, tetrapropyltitanate, tetrabutyltitanate, tetra(2-ethylhexyl)titanate, titanium thylacetonate, titanium acetylacetonate, and diisopropoxybis(ethylacetoacetate)titanium; aluminum compounds such as organoaluminum compounds, such as ethylacetoacetate aluminum diisopropylate, aluminum tris(ethylacetoacetate), alkylacetoacetate aluminum diisopropylate, aluminum tris(acetylacetonate), and aluminum monoacetylacetonate bis(ethylacetoacetate); zirconium compounds such as organozirconium compounds, such as zirconium acetylacetonate, zirconium butoxyacetylacetonate, zirconium bisacetylacetonate, and zirconium ethylacetoacetate; and organosilicon compounds selected from the silanes represented by the general formula $(R^2O)_n SiR^3_{4-n}$ and partially hydrolyzed condensates thereof described in Japanese Unexamined Patent Application Publication No. 2002-322364A, and the like. (Here, $R^2$ represents an alkyl or alkoxyalkyl group, $R^3$ represents an unsubstituted or substituted monovalent hydrocarbon group, and n is 3 or 4. The alkyl groups represented by $R^2$ may be either the same or different, and preferably have from 1 to 4 carbons, and more preferably, are methyl groups, ethyl groups, or propyl groups. Furthermore, another example of the alkoxyalkyl groups represented by $R^2$ is methoxyethyl. Examples of the monovalent hydrocarbon groups represented by $R^3$ include alkyl groups such as a methyl group, ethyl group, propyl group, butyl group, hexyl group, heptyl group, octyl group, nonyl group and decyl group; cycloalkyl groups such as a cyclopentyl group and cyclohexyl group; aryl groups such as a phenyl group, tolyl group, xylyl group and naphthyl group; aralkyl groups such as a benzyl group, phenethyl group and phenylpropyl group; and halogenated alkyl groups a such as 3-chloropropyl group and 3,3,3-trifluoropropyl group. Preferably, it is an alkyl group having from 1 to 4 carbons, a 3,3,3-trifluoropropyl group, or a phenyl group, and most preferably a methyl group.) Among these, from the viewpoint of transparency of the silicone gel and curability of the silicone gel composition, use of the above organotitanium compounds, silane coupling agent reaction condensates, silanes represented by the above general formula $(R^2O)SiR^3_{4-n}$ and partially hydrolyzed condensates thereof, ethyl polysilicates [average molecular formula $Si_mO_{(m-1)}(OC_2H_5)_{2(m+1)}$ (where m is 5 on average), $SiO_2$ content 40 wt %, viscosity 5 mPa s] or combinations thereof is preferred, and use of ethyl polysilicates [average molecular formula
$Si_mO_{(m-1)}(OC_2H_5)_{2(m+1)}$ (where m is 5 on average), $SiO_2$ content 40 wt %, viscosity 5 mPa s] is particularly preferred.

The adhesion promoter (Z) may be used in a range in which the silicone gel composition can form a silicone gel having the above specified loss elastic modulus, complex elastic modulus, and loss tangent. Specifically, it is preferably used in the range from 0.001 to 5.0 mass % with respect to the total amount of silicone gel composition, and more preferably in the range of 0.01 to 1.0 mass %. By using the adhesion promoter (Z) in the range of 0.001 to 5.0 mass % with respect to the total amount of silicone gel, a silicone gel having good bonding to electrical or electronic parts can be formed.

If the silicone gel composition is hydrosilylation reaction-curable, the silicone gel composition may contain (A) an organopolysiloxane containing alkenyl groups, having a viscosity of from 10 to 100,000 mPa s at 25 C.; (B) a linear organopolysiloxane containing hydrogen atoms bonded to silicon atoms at least at both ends of its molecular chain and having a viscosity of from 1 to 10,000 mPa s at 25 C.; and (C) a catalytic amount of a hydrosilylation reaction catalyst.

The organopolysiloxane containing alkenyl groups of component (A) is the primary component of the silicone gel composition, and its viscosity is from 10 to 100,000 mPa s at 25 C. The preferred viscosity of component (A) at 25 C. is in the range of 10 to 10,000 mPa s. If the viscosity of component (A) is less than 10 mPa s, the physical characteristics of the obtained silicone gel tend to decline, while on the other hand, if it exceeds 100,000 mPa s, the handleability of the obtained silicone gel composition tends to decline. Furthermore, the content of component (A) is 80 mass % or more with respect to the total amount of silicone gel composition, and more preferably 85 mass % or more.

Component (A) is constituted of one or two or more types of organopolysiloxane containing alkenyl groups. The molecular structure of such an organopolysiloxane containing alkenyl groups is not particularly limited, and examples include linear, branched, cyclic, three-dimensional network structures, and combinations thereof. Component (A) may be made up of only linear organopolysiloxanes containing alkenyl groups, only organopolysiloxanes containing alkenyl groups having a branched structure, or mixtures of linear organopolysiloxanes containing alkenyl groups and organopolysiloxanes containing alkenyl groups having a branched structure. Among these, component (A) is preferably a mixture of (A-1) organopolysiloxane having alkenyl groups having a branched structure having viscosity of from 10 to 100,000 mPa s at 25 C. and (A-2) linear organopolysiloxane having alkenyl groups having viscosity of from 10 to 100,000 mPa s at 25 C.

The organopolysiloxane having alkenyl groups having a branched structure of component (A-1) means an organopolysiloxane of which the molecular structure is a branched structure or a partially branched linear structure. Specifically, component (A-1) is an organopolysiloxane having $RSiO_{3/2}$ units (R is a monovalent hydrocarbon group) and/or $SiO_{4/2}$ units in the molecular structure, and is preferably an organopolysiloxane made up of $R_2SiO_{2/2}$ units, $RSiO_{3/2}$ units and $R_3SiO_{1/2}$ units. Examples of R in these units include monovalent hydrocarbon groups such as alkyl groups such as a methyl group, ethyl group and propyl group; alkenyl groups such as a vinyl group, allyl group, butenyl group and hexenyl group; aryl groups such as a phenyl group and tolyl group; and halogenated alkyl groups such as a 3,3,3-trifluoropropyl group, and the like, but at least one R in the polymer must be an alkenyl group. In addition, the proportions of these units are not limited, but in this polymer, it is preferred that $R_2SiO_{2/2}$ units account for from 80.0 to 99.65 mol %, $RSiO_{3/2}$ units account for from 0.10 to 10.00 mol %, and the remaining mol % is $R_3SiO_{1/2}$ units. By comprising organopolysiloxane having alkenyl groups having a branched structure in the silicone gel composition, cold resistance of the silicone gel obtained by curing can be improved.

The viscosity of component (A-1) is from 10 to 100,000 mPa s, preferably from 10 to 10,000 mPa s, and particularly preferably from 10 to 5,000 mPa s. If the viscosity of component (A-1) is less than 10 mPa s, the physical characteristics of the obtained silicone gel tend to decline, while on the other hand, if it exceeds 100,000 mPa s, the handleability of the obtained silicone gel composition tends to decline.

The amount of vinyl group moieties ($CH_2\!=\!CH\!-\!$) contained in the molecule of component (A-1) is not particularly limited, but is preferably from 0.05 to 1.50 mass %, and more preferably from 0.10 to 1.00 mass %. By the content of the vinyl group moieties in the molecule of component (A-1) being in such a range, a silicone gel that exhibits the specified ranges of loss elastic modulus, complex elastic modulus, and loss tangent is easily obtained.

Component (A-1) may be constituted of only one type of organopolysiloxane containing alkenyl groups having a branched structure or two or more types of organopolysiloxane containing alkenyl groups having a branched structure. Component (A-1) is preferably constituted of two or more types of organopolysiloxane containing alkenyl groups having a branched structure. In particular, component (A-1) is preferably a mixture of at least two organopolysiloxanes having alkenyl groups having a branched structure, which differ in the amount of vinyl group moieties ($CH_2\!=\!CH\!-\!$) in the molecule. As an advantageous example, component (A-1) comprises two types, a component comprising from 0.10 to 0.30 mass % of vinyl group moieties ($CH_2\!=\!CH\!-\!$) in the molecule, and a component comprising from 0.30 to 1.00 mass % of vinyl group moieties ($CH_2\!=\!CH\!-\!$) in the molecule. The weight ratio of the two organopolysiloxanes comprising different amounts of vinyl groups in component (A-1) is not particularly limited, but is preferably from 1:9 to 9:1, more preferably from 2:8 to 8:2, and even more preferably from 3:7 to 7:3.

Component (A-1) is (A-1T) preferably an organopolysiloxane containing alkenyl groups having a branched structure, having at least one siloxane unit represented by $RSiO_{1.5}$ (R is a monovalent hydrocarbon group), and comprising from 0.10 to 1.00 mass % of vinyl group moieties ($CH_2\!=\!CH\!-\!$) in the molecule and having a viscosity of from 10 to 5,000 mPa s at 25 C.

Component (A-1T) is preferably a mixture of at least two organopolysiloxanes having alkenyl groups having a branched structure, which differ in the amount of vinyl group moieties ($CH_2\!=\!CH\!-\!$) in the molecule. In particular, component (A-1T) is preferably a mixture of component (A-1T1), which comprises from 0.10 to 0.30 mass % of vinyl group moieties (CH$_2$=CH—) in the molecule, and component (A-1T2), which comprises from 0.30 to 1.00 mass % of vinyl group moieties (CH$_2$=CH—) in the molecule, the ratio of (A-1T1):(A-1T2) being from 1:9 to 9:1.

The linear organopolysiloxane containing alkenyl groups of component (A-2) preferably has alkenyl groups on at least both ends of its molecular chain, and may have alkenyl groups only on both ends of its molecular chain. Component (A-2) is not particularly limited, but examples include dimethylpolysiloxanes capped at both molecular terminals by dimethylvinylsiloxy groups, copolymers of dimethylsiloxane and methylphenylsiloxane capped at both molecular terminals by dimethylvinylsiloxy groups, copolymers of dimethylsiloxane and methylvinylsiloxane capped at both molecular terminals by trimethylsiloxy groups, copolymers of dimethylsiloxane, methylvinylsiloxane and methylphenylsiloxane capped at both molecular terminals by trimethylsiloxy groups, copolymers of dimethylsiloxane and methylvinylsiloxane capped at both molecular terminals by silanol groups, polymers in which some of the methyl groups in these polymers are substituted by alkyl groups other than methyl groups, such as ethyl groups or propyl groups, or halogenated alkyl groups such as 3,3,3-trifluoropropyl groups, polymers in which vinyl groups in these polymers are substituted by alkenyl groups other than vinyl groups, such as allyl groups, butenyl groups or hexenyl groups, and mixtures of two or more of these polymers.

The viscosity of component (A-2) is from 10 to 100,000 mPa s, preferably from 10 to 10,000 mPa s, and particularly preferably from 50 to 10,000 mPa s. If the viscosity of component (A-2) is less than 10 mPa s, the physical characteristics of the obtained silicone gel tend to decline, while on the other hand, if it exceeds 100,000 mPa s, the handleability of the obtained silicone gel composition tends to decline.

More preferably, component (A-2) is (A-2L) an organopolysiloxane having alkenyl groups only at both ends of its molecule, and having viscosity of from 50 to 10,000 mPa s at 25 C.

When component (A) contains component (A-1) and component (A-2), the weight ratio of component (A-1) to component (A-2) is not particularly limited, but component (A-1)/component (A-2) is preferably 0.85 or less, and more preferably 0.8 or less. Due to the weight ratio of component (A-1)/component (A-2) being 0.85 or less, the occurrence of air bubbles and cracks in the silicone gel can be effectively suppressed when an electrical or electronic part is sealed or filled with the obtained silicone gel.

The linear organopolysiloxane having hydrogen atoms bonded to silicon atoms on at least both ends of its molecular chain of component (B) acts as a cros slinking agent of the silicone gel composition, and is characterized in that its viscosity is from 1 to 10,000 mPa s at 25 C. Hydrogen atoms bonded to silicon atoms of component (B) may be contained at least at both ends of the molecule, and hydrogen atoms bonded to silicon atoms may be contained on a side chain of the molecule, or hydrogen atoms bonded to silicon atoms may be contained only on both ends of the molecule. Examples of organic groups bonded to silicon atoms other than alkenyl groups in component (B) include alkyl groups such as a methyl group, ethyl group, propyl group, and the like; aryl groups such as a phenyl group, tolyl group, and the like; and monovalent hydrocarbon groups excluding alkenyl groups, such as halogenated alkyl groups such as a 3,3,3-trifluoropropyl group; and the like. Examples of component (B) include dimethylpolysiloxane capped at both molecular terminals by dimethylhydrogensiloxane groups, and the like. Furthermore, as component (B), only one type of organopolysiloxane may be used, or two or more types of organopolysiloxane may be used in combination.

The viscosity at 25 C. of component (B) is from 1 to 10,000 mPa s, preferably from 10 to 10,000 mPa s. If the viscosity of component (B) is less than 1 mPa s, the physical characteristics of the obtained silicone gel tend to decline, while on the other hand, if it exceeds 10,000 mPa s, the handleability of the obtained silicone gel composition tends to decline.

The hydrogen atoms bonded to silicon atoms in component (B) have a compounded amount in component (B) from 0.2 to 5 moles, and preferably from 0.8 to 1.2 moles, per 1 mole of alkenyl groups in component (A). This is because if the molar ratio of the hydrogen atoms bonded to silicon atoms in component (B) per mole of alkenyl groups in component (A) is below 0.2 moles, the obtained silicone gel composition will tend not to sufficiently cure, and on the other hand, if it exceeds 5 moles, the physical characteristics of the obtained silicone gel will tend to decline.

The hydrosilylation reaction catalyst of component (C) is a catalyst for accelerating curing of the hydrosilylation reaction-curable silicone gel composition. Examples of component (C) include platinum-based catalysts such as chloroplatinic acid, alcohol solutions of chloroplatinic acid, olefin complexes of platinum, complexes of platinum and 1,3-divinyl-1,1,3,3-tetramethyldisiloxane, and platinum-supported powders; palladium-based catalysts such as tetrakis (triphenylphosphine) palladium, palladium black, and mixtures with triphenylphosphine; and rhodium-based catalysts. Platinum-based catalysts are preferred.

The compounded amount of component (C) is a catalytic quantity, and in cases where a platinum-based catalyst is used as component (C), for practical reasons, the compounded amount of component (C) is preferably such that the content of platinum metal in the catalyst is from 0.01 to 1000 ppm, and particularly preferably from 0.1 to 500 ppm, by weight in the silicone gel composition.

Other than the above components (A) to (C) and (Z), optional components may be blended in the silicone gel composition within a range such that the object of the present invention is achieved. Examples of optional components include hydrosilylation reaction inhibitors such as acetylene compounds, organophosphate compounds and vinyl group-containing siloxane compounds; inorganic fillers such as fumed silica, wet-produced silica, crushed quartz, titanium oxide, magnesium carbonate, zinc oxide, iron oxide, diatomaceous earth, and carbon black; inorganic fillers obtained by hydrophobic treatment of the surface of such inorganic fillers by organosilicon compounds; organopolysiloxanes not containing hydrogen atoms bonded to silicon atoms or alkenyl groups bonded to silicon atoms, heat resistance-imparting agents, cold resistance-imparting agents, thermally conductive fillers, flame retarders, thixotropy-imparting agents, pigments, dyes, and the like.

A hydrosilylation reaction inhibitor is a component for inhibiting a hydrosilylation reaction of the silicone gel composition, specific examples of which include acetylene-based reaction inhibitors such as ethynylcyclohexanol, and amine-based, carboxylic acid ester-based, phosphite ester-based reaction inhibitors. The added quantity of reaction inhibitors is normally from 0.001 to 5 mass % of the total silicone gel composition. In particular, with the object of improving handleability of the silicone gel composition, acetylene-based compounds such as 3-methyl-1-butyn-3-ol, 3,5-dimethyl-1-hexyn-3-ol, and 3-phenyl-1-butyn-3-ol; enyne compounds such as 3-methyl-3-penten-1-yne and 3,5-dimethyl-3-hexen-1-yne; cycloalkenylsiloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; and triazole compounds such as benzotriazole may be added without particular limitation.

Examples of inorganic fillers include fumed silica, crystalline silica, precipitated silica, hollow fillers, silsesquioxane, fumed titanium dioxide, magnesium oxide, zinc oxide, iron oxide, aluminum hydroxide, magnesium carbonate, calcium carbonate, zinc carbonate, laminar mica, carbon black, diatomaceous earth, and glass fibers; and inorganic fillers obtained by hydrophobic treatment of the surface of such inorganic fillers by organosilicon compounds such as organoalkoxysilane compounds, organochlorosilane compounds or organosilazane compounds. Furthermore, silicone rubber powder, silicone resin powder and the like may also be blended. However, the blended amount of inorganic fillers is, specifically, 20 mass % or less of the silicone gel composition, and particularly preferably 10 mass % or less.

The heat resistance-imparting agent is not particularly limited provided that it can impart heat resistance to the silicone gel, but examples include metal oxides such as iron oxide, titanium oxide, cerium oxide, magnesium oxide, aluminum oxide, and zinc oxide; metal hydroxides such as cerium hydroxide; phthalocyanine compounds, carbon black, cerium silanolate, cerium fatty acid salts, and reaction products of organopolysiloxanes and cerium carboxylates.

The cold resistance-imparting agent is not particularly limited provided that it can impart cold resistance to the silicone gel, but examples include plasticizers such as process oil, naphthene oil, higher fatty acid esters, and dialkyl phthalates.

Examples of the thermally conductive filler include gold, silver, copper, aluminum, nickel, brass, shape memory alloys, solder and similar metal powders; ceramics, glass, quartz, organic resin, and similar powders having gold, silver, nickel, copper, or a similar metal vapor-deposited or plated on the surface thereof; aluminum oxide (alumina), beryllium oxide, chromium oxide, zinc oxide, titanium oxide, crystalline silica, and similar metal oxide-based powders; boron nitride, silicon nitride, aluminum nitride, and similar metal nitride-based powders; boron carbide, titanium carbide, silicon carbide, and similar metal carbide-based powders; aluminum hydroxide, magnesium hydroxide and similar metal hydroxide-based powders; carbon nanotubes, carbon microfibers, diamond, graphite, and similar carbon-based powders; and mixtures of two or more types of these powders. By adding such a thermally conductive filler to the silicone gel composition, a silicone gel having excellent heat resistance can be formed.

The silicone gel composition can be prepared by mixing the components; for example, the composition can be prepared by mixing the above components (A) to (C) and component (Z) and other optional components. The method for mixing the components may be a conventional known method and is not particularly limited, but is normally uniform mixing by simple stiffing. Furthermore, when solid components such as inorganic fillers or the like are contained as optional components, mixing using a mixing device is more preferable. Such a mixing device is not particularly limited, but is exemplified by a single-screw or twin-screw continuous mixer, twin roller, Ross mixer, Hobart mixer, dental mixer, planetary mixer, kneader mixer, Henschel mixer, and the like.

<Silicone Gel>

The silicone gel according to the present invention is obtained by curing the above silicone gel composition, and is characterized by having, at 25C. and a shear frequency of 0.1 Hz, a loss elastic modulus of from $5.0\times10^3$ to $1.0\times10^5$ dyne/cm$^2$, a complex elastic modulus of from $5.0\times10^4$ to $1.0\times10^6$ dyne/cm$^2$, and a loss tangent of 0.3 or less. Furthermore, the complex elastic modulus is preferred to be from $5.0\times10^4$ to $5.0\times10^5$ dyne/cm$^2$. By such a silicone gel, the occurrence of bubbles and cracks can be suppressed and excellent bonding to electrical or electronic parts can be exhibited. As a result, by sealing or filling an electrical or electronic part, an electrical or electronic part having high reliability and stability even under high-temperature conditions can be provided.

The curing mechanism of the silicone gel composition for obtaining silicone gel is not particularly limited, and examples are hydrosilylation reaction curing by alkenyl groups and hydrogen atoms bonded to silicon atoms, dealcoholizing condensation reaction curing by silanol groups and alkoxy groups bonded to silicon atoms, and radical reaction curing by ultraviolet light irradiation, among which hydrosilylation reaction curing is preferred because complete curing is relatively quick. The temperature for curing this hydrosilylation reaction-curable silicone gel composition is not particularly limited, but is normally from 60 C. to 150 C., and more preferably from 70 C to 130 C.

The direct reading (reading unit of ¹/₁₀ mm) of 1/4 consistency stipulated in JIS K 2220 of the silicone gel is preferably from 10 to 80, more preferably from 20 to 80, even more preferably from 20 to 60, particularly preferably from 20 to 50. A silicone gel exhibiting a direct reading of 1/4 consistency stipulated in JIS K 2220 in this range has the silicone gel characteristics of low elastic modulus and low stress, and further, can considerably suppress the occurrence of air bubbles and cracks under high temperature conditions. If this penetration is less than 10, it tends not to exhibit the silicone gel characteristics of low elastic modulus and low stress, and if it exceeds 80, it is too soft, and as a result, tends not to satisfy the ranges of loss elastic modulus, complex elastic modulus, and loss tangent required in the present invention. Note that "direct reading of 1/4 consistency," similar to the penetration test using a 1/4 cone stipulated in JIS K 2220, is the value obtained by dropping a 1/4 cone from the surface of a specimen and reading the depth to which the cone penetrates, using the 1/4 consistency gauge of JIS K 2220.

The silicone gel has excellent heat resistance at high temperatures of 180 C. and above, and the gel does not tend to deteriorate when used for a long period at high temperature. Furthermore, when used in applications for protecting electronic components such as semiconductor chips, SiC semiconductor chips, ICs, hybrid ICs and power devices, the occurrence of air bubbles and cracks in the silicone gel can be suppressed even under high-temperature conditions, and further, because it has good bonding to electrical or electronic parts, it has the advantage of being able to provide electrical or electronic parts having high reliability and stability. Furthermore, because the silicone gel of the present invention is transparent, light-emitting semiconductor elements such as LEDs may be included in the above semiconductor chips.

"Sealant for Electrical or Electronic Parts"

The sealant for electrical or electronic parts according to the present invention is for use in sealing or filling of electrical or electronic parts, and contains the silicone gel composition of the present invention. By such a sealant for electrical or electronic parts, because it contains the above-described silicone gel composition, electrical or electronic parts can be sealed or filled by the silicone gel of the present invention, and as a result, electrical or electronic parts having high reliability and stability even under high-temperature conditions can be provided.

The method for sealing or filling an electrical or electronic part with the sealant for electrical or electronic parts is not limited, but an example is contacting the portion of the electrical or electronic part to be protected with the sealant for electrical or electronic parts, and then curing this composition by heating it, letting it stand at room temperature, or irradiating it with ultraviolet light. A method in which an electrical or electronic part is sealed or filled with a hydrosilylation reaction-curable sealant for electrical or electronic parts and then cured by heating is particularly preferred because complete curing is relatively quick. In this case, when the heating temperature is high, the occurrence of air bubbles and cracks in the sealant for electrical or electronic parts that has been applied for sealing or filling is accelerated, and therefore, heating in the range of 50 C. to 250 C. is preferred, and heating in the range of 70 C. to 130 C. is particularly preferred.

The electrical or electronic part that is sealed or filled by the silicone gel of the present invention is not limited, but because the silicone gel of the present invention can suppress the occurrence of air bubbles and cracks and exhibits good bonding to electrical or electronic parts even under high-temperature conditions, it can be advantageously used in power devices used under high-temperature conditions, particularly power devices such as a motor control, a motor control for transport, a power generation system, or a space transportation system. Furthermore, because the silicone gel of the present invention has a certain degree of cold resistance in addition to the heat resistance demanded in an SiC semiconductor chip (for example, heat resistance of 180 C. or above), it can be advantageously used in power devices that demand the ability to withstand sharp temperature differences, and can improve the durability and reliability of such power devices. Examples of such power devices that demand heat resistance and cold resistance include motor controls used in cold regions such as general-purpose inverter controls, servo motor controls, machine tools or elevators, electric vehicles, hybrid cars or motor controls for rail transport used in cold regions, power generating systems used in cold regions such as solar, wind or fuel cell power generators, space transportation systems used in space, and the like. Note that "cold regions" indicates regions where the temperature falls below OC. Furthermore, the sealant for electrical or electronic parts of the present invention is also effective in electrical or electronic parts having a structure in which the space between electrodes, between electrical elements or between an electrical element and the package in the electrical or electronic part is narrow, or having a structure in which these structures cannot track to the expansion and contraction of the silicone gel. For example, it may be used in electrical circuits or modules on which electrical elements such as semiconductor elements, capacitors and resistors are mounted, i.e., various sensors such as pressure sensors that are generally sealed or filled with silicone gel, and automotive igniters, regulators and the like.

<Electrical or Electronic Part>

The electrical or electronic part according to the present invention is an electrical or electronic part that has been filled or sealed by the silicone gel of the present invention. By such an electrical or electronic part, it has high reliability and stability even under high-temperature conditions because it is equipped with the silicone gel of the present invention.

Examples of such electrical or electronic parts are the same as the electrical or electronic parts described above, particularly power devices such as a motor control, a motor control for transport, a power generation system, or a space transportation system.

<Protection Method for Semiconductor Chip>

The protection method for a semiconductor chip according to the present invention is a method for protecting a semiconductor chip by using the silicone gel of the present invention, an example of which is a protection method for a semiconductor chip that uses the sealant for electrical or electronic parts of the present invention as a sealant. By this protection method for a semiconductor chip, electrical or electronic parts, particularly power devices, having high reliability and stability even under high-temperature conditions can be provided because it uses the silicone gel of the present invention.

EXAMPLES

The silicone gel composition and silicone gel for sealing or filling of electrical or electronic parts of the present invention will be described through examples. Note that in the examples, viscosity is the value measured at 25 C.

Practical Examples 1 to 13 and Comparative Examples 1 to 7

The following components were mixed in the compositions (parts by weight) shown in Tables 1 to 3, and colorless transparent silicone gel compositions were prepared. Note that SiH/SiCH=$CH_2$ in Tables indicates the molar ratio of hydrogen atoms bonded to silicon atoms contained in the organopolysiloxane containing hydrogen atoms bonded to silicon atoms per 1 mole of alkenyl groups in the organopolysiloxane containing alkenyl groups in the composition.

Component a-1: Organopolysiloxane containing alkenyl groups having a branched structure, having viscosity of 870 mPa s, comprising 93.50 mol % $(CH_3)_2SiO_{2/2}$ units, 3.30 mol % $CH_3SiO_{3/2}$ units, 1.60 mol % $(CH_3)_3SiO_{1/2}$ units, and 1.60 mol % $(CH_3)_2(CH_2=CH)SiO_{1/2}$ units (vinyl group content=0.58 wt %)

Component a-2: Organopolysiloxane containing alkenyl groups having a branched structure, having viscosity of 420 mPa s, comprising 93.50 mol % $(CH_3)_2SiO_{2/2}$ units, 0.80 mol % $CH_3SiO_{3/2}$ units, 5.10 mol % $(CH_3)_3SiO_{1/2}$ units, and 0.60 mol % $(CH_3)_2(CH_2=CH)SiO_{1/2}$ units (vinyl group content=0.22 wt %)

Component a-3: Linear dimethylpolysiloxane capped at both molecular terminals by dimethylvinylsiloxy groups, having viscosity of 2,000 mPa s (vinyl group content=0.23 wt %)

Component a-4: Linear dimethylpolysiloxane capped at both molecular terminals by dimethylvinylsiloxy groups, having viscosity of 360 mPa s (vinyl group content=0.48 wt %)

Component b-1: Dimethylpolysiloxane capped at both molecular terminals by dimethylhydrogensiloxy groups, having viscosity of 16 mPa s (silicon-bonded hydrogen atom content=0.13 wt %)

Component b-2: Dimethylsiloxane-methylhydrogensiloxane copolymer capped at both molecular terminals by dimethylhydroxy groups, having viscosity of 22 mPa s (silicon-bonded hydrogen atom content=0.14 wt %)

Component c: Complex of platinum and 1,3-divinyl-1,1,3,3,-tetramethyldisiloxane, having a platinum concentration of 0.5 wt % (vinyl group content=2.48 wt %)

Component z-1: Ethyl polysilicate [average molecular formula $Si_mO_{(m-1)}(OC_2H_5)_{2(m+1)}$ (where m is 5 on average), Sift content 40 wt %, viscosity 5 mPa s]

Component z-2: Diisopropoxybis(ethylacetoacetate)titanium

Component z-3: 3-glycidoxypropyltrimethoxysilane

Component z-4: 1,6-bis(hexamethoxyl)hexane

Component z-5: Carbasilatran (reaction mixture of epoxysilane and aminosilane)

The obtained silicone gel compositions of Practical Examples 1 to 13 and Comparative Examples 1 to 7 were evaluated as follows. These results are shown in Tables 1 to 3.

<Loss Elastic Modulus, Complex Elastic Modulus, and Loss Tangent>

Silicone gel in the shape of a circular plate of thickness from 5 to 6 mm and diameter of 25 mm was created by heating the silicone gel composition for 1 hour at 80 C.The loss elastic modulus, complex elastic modulus, and loss tangent of this silicone gel were measured by a dynamic viscoelasticity measurement apparatus manufactured by Rheometrics, Inc. (product name: Dynamic Analyzer ARES) at 25 C., shear frequency 0.1 Hz, strain 2%.

<1/4 Consistency>

Silicone gel was created by gently pouring the silicone gel composition for sealing or filling of electrical or electronic parts into a 50-mL glass beaker and then heating for 1 hour at 80 C. The 1/4 consistency of this silicone gel was measured according to the method stipulated in JIS K 2220. Note that 1/4 consistency of the silicone gel was the direct reading (reading unit of 1/10 mm) of 1/4 consistency stipulated in JIS K 2220, as described above.

<Presence or Absence of Air Bubbles and Cracks>

Three electrodes (2) having a diameter of 2 mm and length of 80 mm were placed in parallel on a glass Petri dish (4) having a diameter of 95 mm and height of 12 mm, and on these electrodes, a substrate of polybutylene terephthalate (3) having dimensions of 75 mm×25 mm×2 mm (PBT, brand name "Duranex 2002") was laid, creating an electrical or electronic part. The silicone gel composition was poured gently into the glass Petri dish in an amount to result in a height of 10 mm, and after the glass Petri dish was degassed under reduced pressure of 5 mmHg or less for 3 minutes at room temperature, the silicone gel composition was cured by heating for 1 hour in an 80 C oven to form a silicone gel (1 or 1'), and an electrical or electronic part sample was obtained. This sample was left to stand for 24 hours on a hot plate preheated to 180 C, and then the occurrence of air bubbles or cracks (5) and the degree thereof in the silicone gel that sealed or filled the electrical or electronic part were observed macroscopically. The numbers 5 to 1 representing the presence or absence of air bubbles or cracks and the degree thereof shown in Tables 1 to 3 have the following meanings (=state of sample). Here, the size of an air bubble or crack indicates the length of the longest portion of that air bubble or crack. Furthermore, an optical photographic image from the top surface of the electrical or electronic part sample evaluated in Practical Example 8 is shown in FIG. 1, and an optical photographic image from the top surface of the electrical or electronic part sample evaluated in Comparative Example 4 is shown in FIG. 2. In the electrical or electronic part sample evaluated in Practical Example 8, no large air bubbles or cracks were seen in the silicone gel, and no interface debonding from the substrate was seen. On the other hand, in the electrical or electronic part sample evaluated in Comparative Example 4, air bubbles or cracks of 20 mm or greater in size occurred.

5: No air bubbles or cracks formed at all, and no interface debonding from the substrate was seen.

4: Air bubbles or cracks less than 1 mm in size occurred, but no interface debonding from the substrate was seen, and it could be used without practical problems.

3: Air bubbles or cracks at least 1 mm but less than 10 mm in size occurred, but no interface debonding from the substrate was seen, and it could be used without major practical problems.

2: Air bubbles or cracks from 10 to 20 mm in size occurred, and/or interface debonding from the substrate was seen, and thus there were problems in practical use.

1: Air bubbles or cracks of 20 mm or greater in size occurred, and/or interface debonding from the substrate was seen 1 $cm^2$ or more, and practical use was very problematic.

TABLE 1

Practical Examples 1 to 6

| | Practical Examples | | | | | |
|---|---|---|---|---|---|---|
| | 1 | 2 | 3 | 4 | 5 | 6 |
| Component a-1 | 37.7 | 22.9 | 36.3 | 24.1 | 21.6 | 23.6 |
| Component a-2 | 0 | 14.2 | 0 | 0 | 15.2 | 19.9 |
| Component a-3 | 0 | 47.9 | 47.0 | 66.0 | 0.0 | 0 |
| Component a-4 | 48.6 | 6.3 | 6.2 | 0 | 51.2 | 44.9 |
| Component b-1 | 13.4 | 8.2 | 10.1 | 9.4 | 12.1 | 11.0 |
| Component b-2 | 0 | 0 | 0 | 0 | 0 | 0 |
| Component c | 0.08 | 0.08 | 0.08 | 0.09 | 0.09 | 0.08 |
| Component z-1 | 0.16 | 0.16 | 0.15 | 0.17 | 0.16 | 0.16 |
| Component z-2 | 0.02 | 0.02 | 0.02 | 0.03 | 0.02 | 0.02 |
| Component z-3 | 0 | 0 | 0 | 0 | 0 | 0 |
| Component z-4 | 0 | 0 | 0 | 0 | 0 | 0 |
| Component z-5 | 0 | 0 | 0 | 0 | 0 | 0 |
| Total | 100 | 100 | 100 | 100 | 100 | 100 |
| SiH/SiCH=$CH_2$ | 1.03 | 0.94 | 1.02 | 1.12 | 1.05 | 0.97 |
| T unit content/straight chain | 0.78 | 0.69 | 0.68 | 0.37 | 0.72 | 0.97 |
| 1/4 consistency | 26 | 36 | 24 | 30 | 39 | 40 |
| Loss elastic modulus (dyne/$cm^2$) | $8.6 \times 10^3$ | $1.2 \times 10^4$ | $1.3 \times 10^4$ | $2.8 \times 10^4$ | $7.7 \times 10^3$ | $5.3 \times 10^3$ |

TABLE 1-continued

Practical Examples 1 to 6

| | Practical Examples | | | | | |
|---|---|---|---|---|---|---|
| | 1 | 2 | 3 | 4 | 5 | 6 |
| Complex elastic modulus (dyne/cm$^2$) | $1.3 \times 10^5$ | $9.1 \times 10^4$ | $1.5 \times 10^5$ | $1.2 \times 10^5$ | $6.5 \times 10^4$ | $5.9 \times 10^4$ |
| Loss tangent | 0.07 | 0.16 | 0.09 | 0.25 | 0.12 | 0.09 |
| Degree of air bubbles, cracks, debonding | 5 | 5 | 4 | 5 | 5 | 3 |

TABLE 2

Practical Examples 7 to 13

| | Practical Examples | | | | | | |
|---|---|---|---|---|---|---|---|
| | 7 | 8 | 9 | 10 | 11 | 12 | 13 |
| Component a-1 | 37.7 | 37.7 | 37.7 | 0 | 22.7 | 22.7 | 22.7 |
| Component a-2 | 0 | 0 | 0 | 0 | 0 | 0 | 0 |
| Component a-3 | 0 | 0 | 0 | 0 | 61.6 | 61.7 | 61.7 |
| Component a-4 | 48.6 | 48.6 | 48.6 | 87.5 | 0 | 0 | 0 |
| Component b-1 | 13.4 | 13.4 | 13.4 | 10.3 | 8.5 | 4.3 | 5.9 |
| Component b-2 | 0 | 0 | 0 | 2.1 | 1.2 | 4.2 | 2.7 |
| Component c | 0.08 | 0.08 | 0.08 | 0.08 | 0.08 | 0.08 | 0.08 |
| Component z-1 | 0 | 0 | 0 | 0.12 | 0.16 | 0.16 | 0.16 |
| Component z-2 | 0 | 0 | 0 | 0.02 | 0.03 | 0.03 | 0.03 |
| Component z-3 | 0.5 | 0 | 0 | 0 | 0 | 0 | 0 |
| Component z-4 | 0 | 0.5 | 0 | 0 | 0 | 0 | 0 |
| Component z-5 | 0 | 0 | 0.5 | 0 | 0 | 0 | 0 |
| Total | 100 | 100 | 100 | 100 | 100 | 100 | 100 |
| SiH/SiCH=CH$_2$ | 1.03 | 0.94 | 1.02 | 1.05 | 0.95 | 0.95 | 0.95 |
| T unit content/straight chain | 0.78 | 0.78 | 0.78 | 0 | 0.37 | 0.37 | 0.37 |
| ¼ consistency | 26 | 26 | 26 | 21 | 26 | 11 | 14 |
| Loss elastic modulus (dyne/cm$^2$) | $8.6 \times 10^3$ | $8.6 \times 10^3$ | $8.6 \times 10^3$ | $7.5 \times 10^4$ | $4.0 \times 10^4$ | $4.0 \times 10^4$ | $3.1 \times 10^4$ |
| Complex elastic modulus (dyne/cm$^2$) | $1.3 \times 10^3$ | $1.3 \times 10^3$ | $1.2 \times 10^3$ | $3.1 \times 10^6$ | $2.7 \times 10^6$ | $3.1 \times 10^6$ | $2.7 \times 10^6$ |
| Loss tangent | 0.07 | 0.07 | 0.07 | 0.25 | 0.15 | 0.05 | 0.09 |
| Degree of air bubbles, cracks, debonding | 4 | 4 | 4 | 5 | 5 | 4 | 4 |

TABLE 3

Comparative Examples 1 to 7

| | Comparative Examples | | | | | | |
|---|---|---|---|---|---|---|---|
| | 1 | 2 | 3 | 4 | 5 | 6 | 7 |
| Component a-1 | 14 | 24.7 | 21.6 | 0 | 13.2 | 37.7 | 0 |
| Component a-2 | 40.5 | 0 | 15.2 | 87.2 | 38.2 | 0 | 0 |
| Component a-3 | 0 | 66.5 | 0.0 | 0 | 0 | 0 | 0 |
| Component a-4 | 35.0 | 0 | 51.2 | 6.3 | 38.8 | 48.6 | 37.5 |
| Component b-1 | 9.5 | 8.49 | 12.1 | 6.3 | 9.6 | 13.4 | 9.9 |
| Component b-2 | 0 | 0 | 0 | 0 | 0 | 0 | 2.0 |
| Component c | 0.08 | 0.09 | 0.09 | 0.10 | 0.08 | 0.08 | 0.07 |
| Component z-1 | 0.16 | 0.17 | 0 | 0.16 | 0.16 | 0 | 0.12 |
| Component z-2 | 0.02 | 0.03 | 0 | 0.03 | 0.03 | 0 | 0.02 |
| Component z-3 | 0 | 0 | 0 | 0 | 0 | 0 | 0 |
| Component z-4 | 0 | 0 | 0 | 0 | 0 | 0 | 0 |
| Component z-5 | 0 | 0 | 0 | 0 | 0 | 0 | 0 |
| Total | 100 | 100 | 100 | 100 | 100 | 100 | 100 |
| SiH/SiCH=CH$_2$ | 0.98 | 1.00 | 1.05 | 0.98 | 0.97 | 1.02 | 1.00 |
| T unit content/straight chain | 1.56 | 0.37 | 0.72 | 13.9 | 1.2 | 0.78 | 0 |

TABLE 3-continued

Comparative Examples 1 to 7

| | Comparative Examples | | | | | | |
|---|---|---|---|---|---|---|---|
| | 1 | 2 | 3 | 4 | 5 | 6 | 7 |
| ¼ consistency | 56 | 34 | 39 | 80 | 60 | 26 | 42 |
| Loss elastic modulus (dyne/cm$^2$) | $2.4 \times 10^3$ | $3.6 \times 10^4$ | $7.7 \times 10^3$ | $3.0 \times 10^2$ | $2.2 \times 10^3$ | $8.6 \times 10^3$ | $4.1 \times 10^4$ |
| Complex elastic modulus (dyne/cm$^2$) | $2.9 \times 10^4$ | $1.1 \times 10^5$ | $6.5 \times 10^4$ | $9.1 \times 10^3$ | $2.9 \times 10^4$ | $1.3 \times 10^5$ | $9.2 \times 10^4$ |
| Loss tangent | 0.08 | 0.33 | 0.12 | 0.03 | 0.08 | 0.07 | 0.5 |
| Degree of air bubbles, cracks, debonding | 1 | 1 | 1 | 1 | 1 | 1 (interface debonding) | 1 |

INDUSTRIAL APPLICABILITY

Compared to conventional silicone gel, the silicone gel obtained from the silicone gel composition of the present invention, when it seals or fills an electrical or electronic part, can suppress the occurrence of air bubbles or cracks and has excellent bonding to the electrical or electronic part even when used under high temperature, and therefore, it can be advantageously used in sealants and protective materials of various semiconductor elements. In particular, it can be advantageously used in sealants and protective materials of power devices used under high-temperature conditions, such as a motor control, a motor control for transport, a power generation system, or a space transportation system. Furthermore, because the silicone gel obtained from the silicone gel composition of the present invention has a certain degree of cold resistance in addition to the heat resistance demanded in an SiC semiconductor chip (for example, heat resistance of 180 C. or above), it can be advantageously used in sealants and protective materials of power devices that demand the ability to withstand sharp temperature differences, and can improve the durability and reliability of such power devices. Examples of such power devices that demand heat resistance and cold resistance include motor controls used in cold regions such as general-purpose inverter controls, servo motor controls, machine tools or elevators, electric vehicles, hybrid cars or motor controls for rail transport used in cold regions, power generating systems used in cold regions such as solar, wind or fuel cell power generators, space transportation systems used in space, and the like. Note that "cold regions" indicates regions where the temperature falls below OC. Furthermore, the silicone gel composition of the present invention is also effective in electrical or electronic parts having a structure in which the space between electrodes, between electrical elements or between an electrical element and the package in the electrical or electronic part is narrow, or having a structure in which these structures cannot track to the expansion and contraction of the silicone gel. For example, it is advantageously used in sealants and protective materials of electrical circuits or modules on which electrical elements such as semiconductor elements, capacitors and resistors are mounted, i.e., various sensors such as pressure sensors that are generally sealed or filled with silicone gel, and automotive igniters, regulators and the like. Additionally, because the silicone gel obtained from the silicone gel composition of the present invention is transparent, it is useful as optical materials or electronic materials used in general illumination devices and the like, for example, lenses (including secondary optical lens materials provided on the outside of LED packages), sealing materials of light-emitting semiconductor elements, white reflector materials, light-diffusing materials, wavelength-converting materials, and sealants or protective materials of waveguides and plate-like, film-like and sheet-like light guide materials.

REFERENCE SIGNS LIST 1, 1' Silicone gel
2 Electrode
3 Polybutylene terephthalate
4 Glass Petri dish
5 Air bubble or crack

The invention claimed is:
1. A silicone gel composition comprising:
(A-1T) an organopolysiloxane having alkenyl groups, a branched structure having at least one siloxane unit represented by $RSiO_{1.5}$, where R represents a monovalent hydrocarbon group, from 0.10 to 1.00 mass % of vinyl group moieties ($CH_2$=CH—) in a molecule, and a viscosity of from 10 to 5,000 mPa·s at 25° C.;
(A-2L) a linear organopolysiloxane having alkenyl groups only at both ends of its molecular chain, and a viscosity of from 50 to 10,000 mPa·s at 25° C.;
wherein the weight ratio of component (A-1T)/component (A-2L) is 0.97 or 0.85 or less;
(B) a linear organopolysiloxane having hydrogen atoms bonded to silicon atoms at least at both ends of its molecular chain, and a viscosity of from 1 to 10,000 mPa·s at 25° C.;
wherein component (B) is present in an amount such that a quantity of the hydrogen atoms bonded to silicon atoms is from 0.2 to 5 moles per 1 mole of alkenyl groups contained in components (A-1T) and (A-2L); and
(Z) at least one adhesion promoter;
wherein the silicone gel composition cures to form a silicone gel having, at 25° C. and a shear frequency of 0.1 Hz, a loss elastic modulus of from $5.0 \times 10^3$ to $1.0 \times 10^5$ dyne/cm$^2$, a complex elastic modulus of from $5.0 \times 10^4$ to $1.0 \times 10^6$ dyne/cm$^2$, and a loss tangent of 0.3 or less.

2. The silicone gel composition according to claim 1, which is curable through hydrosilylation reaction.

3. The silicone gel composition according to claim 2, further comprising:
(C) a catalytic amount of a hydrosilylation reaction catalyst.

4. The silicone gel composition according to claim 3, wherein component (A-1T) is a mixture of at least two organopolysiloxanes containing alkenyl groups, each having a branched structure, which differ in an amount of vinyl group moieties (CH2=CH—) in a molecule.

5. The silicone gel composition according to claim 4, wherein component (A-1T) is a mixture of component (A-1T1), which comprises from 0.10 to 0.30 mass % of vinyl group moieties (CH2=CH—) in a molecule, and component (A-1T2), which comprises from 0.30 to 1.00 mass % of vinyl group moieties (CH2=CH—) in a molecule, the ratio of (A-1T1):(A-1T2) being from 1:9 to 9:1.

6. A silicone gel prepared by curing the silicone gel composition according to claim 1.

7. The silicone gel according to claim 6, having 1/4 consistency as stipulated in JIS K 2220 of from 10 to 80.

8. A method of manufacturing an electrical or electronic part equipped with a silicone gel, said method comprising the step of:
   sealing or filling the electrical or electronic part with a silicone gel composition;
   wherein the silicone gel composition is according to claim 1.

9. The method according to claim 8, wherein the electrical or electronic part is selected from the group of a semiconductor chip, an integrated circuit (IC), a hybrid IC, and a power device.

10. The method according to claim 9, wherein the power device is a motor control, a motor control for transport, a power generation system, or a space transportation system.

11. The method according to claim 8, further defined as a method comprising the steps of:
    (1) sealing or filling the electrical or electronic part with a silicone gel composition; and
    (2) curing the silicone gel composition to form the silicone gel;
    wherein the silicone gel composition is according to claim 1.

12. The method according to claim 8, further defined as a method comprising the steps of:
    (1) providing the electrical or electronic part;
    (2) sealing or filling the electrical or electronic part with a silicone gel composition; and
    (3) curing the silicone gel composition to form the silicone gel;
    wherein the silicone gel composition is according to claim 1.

13. The silicone gel composition according to claim 1, wherein the weight ratio of component (A-1T)/component (A-2L) is 0.85 or less.

14. The silicone gel composition according to claim 1, wherein component (Z) is selected from the group of organotitanium compounds; silane coupling agent reaction condensates; silanes represented by the general formula $(R^2O)_n SiR^3_{4-n}$ and partially hydrolyzed condensates thereof, where each $R^2$ is an alkyl or alkoxyalkyl group, each $R^3$ represents an unsubstituted or substituted monovalent hydrocarbon group, and n is 3 or 4; ethyl polysilicates having the average molecular formula $Si_m O_{(m-1)}(OC_2H_5)_{2(m+1)}$, where m is 5 on average; and combinations thereof.

15. The silicone gel composition according to claim 1, wherein component (Z) is present in an amount of from 0.001 to 5.0 mass % based on the total amount of the silicone gel composition.

16. The silicone gel composition according to claim 1, wherein component (Z) comprises an ethyl polysilicate, the ethyl polysilicate having the average molecular formula $Si_m O_{(m-1)}(OC_2H_5)_{2(m+1)}$, where m is 5 n average, having a $SiO_2$ content of 40wt %, and having a viscosity of 5 mPa·s.

17. A silicone gel composition comprising:
    (Z) at least one adhesion promoter;
    wherein component (Z) comprises an ethyl polysilicate having the average molecular formula $Si_m O_{(m-1)}(OC_2H_5)_{2(m+1)}$, where m is 5 on average, a $SiO_2$ content of 40 wt %, and a viscosity of 5 mPa·s; and
    wherein the silicone gel composition cures to form a silicone gel having, at 25° C. and a shear frequency of 0.1 Hz, a loss elastic modulus of from $5.0 \times 10^3$ to $1.0 \times 10^5$ dyne/cm$^2$, a complex elastic modulus of from $5.0 \times 10^4$ to $1.0 \times 10^6$ dyne/cm$^2$, and a loss tangent of 0.3 or less.

\* \* \* \* \*

UNITED STATES PATENT AND TRADEMARK OFFICE
CERTIFICATE OF CORRECTION

PATENT NO. : 10,155,852 B2
APPLICATION NO. : 15/121892
DATED : December 18, 2018
INVENTOR(S) : Hiroji Enami Page 1 of 1

It is certified that error appears in the above-identified patent and that said Letters Patent is hereby corrected as shown below:

In the Claims

Column 22, Claim 16, Line 26:
"where m is 5 n average, having a"
Should read:
-- where m is 5 on average, having a --

Signed and Sealed this
Fourteenth Day of May, 2019

Andrei Iancu
*Director of the United States Patent and Trademark Office*